(12) United States Patent
Yajima et al.

(10) Patent No.: US 7,754,514 B2
(45) Date of Patent: Jul. 13, 2010

(54) METHOD OF MAKING A LIGHT EMITTING ELEMENT

(75) Inventors: Takayoshi Yajima, Aichi-ken (JP); Masanobu Ando, Aichi-ken (JP); Toshiya Uemura, Aichi-ken (JP); Akira Kojima, Aichi-ken (JP); Koji Kaga, Aichi-ken (JP)

(73) Assignee: Toyoda Gosei Co., Ltd., Nishikasugai-gun, Aichi-gun (JP)

( * ) Notice: Subject to any disclaimer, the term of this patent is extended or adjusted under 35 U.S.C. 154(b) by 496 days.

(21) Appl. No.: 11/892,258

(22) Filed: Aug. 21, 2007

(65) Prior Publication Data
US 2008/0254562 A1    Oct. 16, 2008

(30) Foreign Application Priority Data

Aug. 22, 2006  (JP)  ............... 2006-225671
Jul. 17, 2007   (JP)  ............... 2007-185421
Aug. 8, 2007   (JP)  ............... 2007-206865

(51) Int. Cl.
*H01L 21/00* (2006.01)

(52) U.S. Cl. ............... 438/46; 438/47; 438/745

(58) Field of Classification Search ............ 438/29, 438/42, 46, 47, 745, 746, 747, 752, 753
See application file for complete search history.

(56) References Cited

U.S. PATENT DOCUMENTS

| | | |
|---|---|---|
| 7,105,865 B2 * | 9/2006 | Nakahata et al. ............. 257/103 |
| 7,208,334 B2 * | 4/2007 | Asakawa et al. .............. 438/29 |
| 2006/0094139 A1 * | 5/2006 | Chen et al. ................... 438/22 |

FOREIGN PATENT DOCUMENTS

| | | |
|---|---|---|
| JP | 8-102551 | 4/1996 |
| JP | 2005-19835 | 1/2005 |
| JP | 2005-223362 | 8/2005 |

* cited by examiner

*Primary Examiner*—Kevin M Picardat
(74) *Attorney, Agent, or Firm*—McGinn IP Law Group, PLLC

(57) ABSTRACT

A method of making a light emitting element, the light emitting element with a semiconductor layer represented by: $Al_X In_Y Ga_{1-X-Y} N$ ($0 \leq X \leq 1$, $0 \leq Y \leq 1$, $0 \leq X+Y \leq 1$), has the step of wet-etching a surface of the semiconductor layer by using an etching solution to have a roughened surface on the semiconductor layer. The wet-etching is conducted without irradiating the surface of the semiconductor layer with a light with a wavelength region corresponding to energy higher than bandgap energy of the semiconductor layer.

10 Claims, 26 Drawing Sheets

FIG.2

| SAMPLE No. | ETCHING CONDITIONS (KOH) | | TOTAL RADIANT FLUX NORMARIZED |
|---|---|---|---|
| | CONC M | TEMP °C | |
| 1 | 0.1 | 20 | 0.607 |
| 2 | | 20 | 0.614 |
| 3 | | 40 | 0.686 |
| 4 | | 40 | 0.845 |
| 5 | | 60 | 0.870 |
| 6 | | 60 | 0.749 |
| 7 | | 80 | 0.994 |
| 8 | | 80 | 0.982 |
| 9 | 0.5 | 20 | 0.637 |
| 10 | | 20 | 0.607 |
| 11 | | 40 | 0.695 |
| 12 | | 40 | 0.810 |
| 13 | | 60 | 0.947 |
| 14 | | 60 | 0.990 |
| 15 | | 80 | 0.972 |
| 16 | | 80 | 0.955 |
| 17 | 1.0 | 20 | 0.655 |
| 18 | | 20 | 0.659 |
| 19 | | 40 | 0.734 |
| 20 | | 40 | 0.746 |
| 21 | | 60 | 0.962 |
| 22 | | 60 | 0.971 |
| 23 | | 80 | 0.953 |
| 24 | | 80 | 0.986 |
| 25 | 2.0 | 20 | 0.653 |
| 26 | | 20 | 0.623 |
| 27 | | 40 | 0.733 |
| 28 | | 40 | 0.785 |
| 29 | | 60 | 0.983 |
| 30 | | 60 | 0.945 |
| 31 | | 80 | 0.976 |
| 32 | | 80 | 0.965 |
| 33 | 4.0 | 20 | 0.683 |
| 34 | | 20 | 0.658 |
| 35 | | 40 | 0.750 |
| 36 | | 40 | 0.762 |
| 37 | | 60 | 0.954 |
| 38 | | 60 | 1.000 |
| 39 | | 80 | 0.921 |
| 40 | | 80 | 0.962 |
| 41 | 8.0 | 20 | 0.596 |
| 42 | | 20 | 0.599 |
| 43 | | 40 | 0.692 |
| 44 | | 40 | 0.736 |
| 45 | | 60 | 0.924 |
| 46 | | 60 | 0.760 |
| 47 | | 80 | 0.944 |
| 48 | | 80 | 0.935 |

FIG.11

| SAMPLE No. | AFTER | | BEFORE | TRF RATIO | TEMP (°C) |
|---|---|---|---|---|---|
| | CURRENT (mA) | TRF (mW) | TRF (mW) | | |
| 2-1 | 350 | 54.8 | 57.4 | 0.95 | 20 |
| 2-2 | 350 | 57.9 | 58.2 | 1.00 | 20 |
| 2-3 | 350 | 60.0 | 56.8 | 1.06 | 35 |
| 2-4 | 350 | 62.2 | 56.0 | 1.11 | 35 |
| 2-5 | 350 | 60.4 | 56.6 | 1.07 | 40 |
| 2-6 | 350 | 58.4 | 51.5 | 1.13 | 40 |
| 2-7 | 350 | 64.2 | 53.5 | 1.20 | 45 |
| 2-8 | 350 | 62.9 | 58.1 | 1.08 | 45 |
| 2-9 | 350 | 80.7 | 59.5 | 1.35 | 50 |
| 2-10 | 350 | 73.9 | 57.8 | 1.28 | 50 |
| 2-11 | 350 | 84.9 | 58.3 | 1.46 | 55 |
| 2-12 | 350 | 85.4 | 59.9 | 1.42 | 55 |
| 2-13 | 350 | 78.7 | 54.6 | 1.44 | 60 |
| 2-14 | 350 | 78.4 | 53.8 | 1.46 | 60 |
| 2-15 | 350 | 76.3 | 54.2 | 1.41 | 65 |
| 2-16 | 350 | 79.9 | 54.2 | 1.48 | 65 |
| 2-17 | 350 | 77.3 | 57.3 | 1.35 | 70 |
| 2-18 | 350 | 77.0 | 54.7 | 1.41 | 70 |

NOTES  AFTER = AFTER THE FINE PROCESSING
BEFORE = BEFORE THE FINE PROCESSING
TRF = TOTAL RADIANT FLUX
TRF RATIO = TOTAL RADIANT FLUX RATIO BETWEEN AFTER AND BEFORE THE FINE PROCESSING
TEMP = TEMPERATURE OF THE FINE PROCESSING

METHOD OF MAKING A LIGHT EMITTING ELEMENT

The present application is based on Japanese patent applications Nos. 2006-225671, 2007-185421 and 2007-206865, the entire contents of which are incorporated herein by reference.

BACKGROUND OF THE INVENTION

1. Field of the Invention

This invention relates to a method of making a light emitting element including a semiconductor layer represented by: $Al_XIn_YGa_{1-X-Y}N$ ($0 \leq X \leq 1$, $0 \leq Y \leq 1$, $0 \leq X+Y \leq 1$).

2. Description of the Related Art

Conventional light emitting elements include LED (Light Emitting Diode) elements with a GaN based semiconductor layer. Generally, the LED elements are formed by sequentially growing, through AlN buffer layer on a sapphire substrate, an n-GaN layer, an MQW (Multiple Quantum Well) layer and a p-GaN layer.

When a current is fed between the n-GaN layer and the p-GaN layer, the MQW layer emits light.

If there is a significant difference in refractive index between the semiconductor layer and a material for sealing the semiconductor layer, total reflection easily occurs in the LED element so that the light extraction efficiency lowers.

In order to solve this problem, it is tried to process the surface of the semiconductor layer in nano-order. However, the process equipment grows in size and the surface of all the LED elements produced is difficult to process at good stability and reproducibility in case of processing a wafer with a relatively large area or a number of the LED elements arrayed.

JP-A-2005-223362 discloses a method of making an LED element that an end surface of the LED element is etched to form a nonspecular surface by using KOH aqueous solution. The LED element of JP-A-2005-223362 uses a GaN substrate as a growth substrate instead of the sapphire substrate, and the nonspecular surface is formed on the end surface as well as on the N-surface of the GaN substrate by etching.

JP-A-2005-019835 discloses a nitride semiconductor laser element that GaN is wet-etched using alkali aqueous solution such as TMAH (Tetra-Methyl-Ammonium-Hydroxide). In the nitride semiconductor laser element of JP-A-2005-019835, a current-confining structure is formed by etching AlGaN with a high Al ratio by the TMAH aqueous solution as an alkali developing solution.

However, in the above methods for making the LED element, the etching process is conducted in an environment using a lighting system etc., so that light with a wavelength region higher than the band gap energy enters into the semiconductor layer during the etching process.

Thus, pairs of electron and hole are generated on the surface of the semiconductor layer by light excitation, and the hole may break an atomic binding in the crystal of the semiconductor layer, so that erosion nonuniformity due to electric potential imbalance cannot be prevented.

As a result, as shown in FIG. 17, there is the problem that the shape and distribution of the concavity and convexity formed on the roughened surface of the semiconductor layer is nonuniform along with the reduction of the processing accuracy, so that it is not possible to sufficiently improve the light extraction efficiency by accurately conducting the fine processing.

JP-A-2005-019835 mentions that the AlGaN layer with a high Al ratio can be etched by the TMAH aqueous solution, but the AlGaN layer with a low Al ratio or GaN layer cannot be etched thereby so that such a layer functions as an etching stop layer.

SUMMARY OF THE INVENTION

It is an object of the invention to provide a method of making a light emitting element that allows the shape and distribution of concavities and convexities formed on a roughened surface of a semiconductor layer to be improved to enhance the light extraction efficiency of the light emitting element.

(1) According to one embodiment of the invention, a method of making a light emitting element, the light emitting element comprising a semiconductor layer represented by: $Al_XIn_YGa_{1-X-Y}N$ ($0 \leq X \leq 1$, $0 \leq Y \leq 1$, $0 \leq X+Y \leq 1$), comprising the step of wet-etching a surface of the semiconductor layer by using an etching solution to have a roughened surface on the semiconductor layer, wherein the wet-etching is conducted without irradiating the surface of the semiconductor layer with a light comprising a wavelength region corresponding to energy higher than a bandgap energy of the semiconductor layer.

In the above method, since light with a wavelength region corresponding to energy higher than the bandgap energy of the semiconductor layer does not enter into the semiconductor layer during the etching process, pairs of electron and hole are not generated in the semiconductor layer by the light excitation like before.

Thus, during the etching process of the semiconductor layer, the etching process is advanced stepwise stating from a lower portion in bonding strength on the crystal surface of the semiconductor layer. Therefore, the surface of the semiconductor layer is eroded uniformly to have a roughened surface thereon, and the roughened surface can have pyramidal projections with crystal surfaces and facets {10-1-1} arranged regularly thereon after the etching process.

In the above embodiment (1), the following modifications and changes can be made.

(i) The surface of the semiconductor layer to be wet-etched comprises an N (nitrogen) surface.

(ii) The etching solution comprises an alkaline aqueous solution.

(iii) The alkaline aqueous solution comprises KOH aqueous solution.

(iv) The KOH aqueous solution comprises a temperature in the range of 60° C. to 80° C. during the wet etching.

(v) The KOH aqueous solution comprises a concentration in the range of 0.5 mol/L to 4.0 mol/L.

(vi) The KOH aqueous solution comprises a concentration in the range of 1.0 mol/L to 2.0 mol/L.

(vii) The alkaline aqueous solution comprises tetramethylammonium hydroxide (TMAH) aqueous solution.

(viii) The TMAH aqueous solution comprises a temperature in the range of 35° C. to 70° C. during the wet etching.

(ix) The TMAH aqueous solution comprises a temperature in the range of 55° C. to 65° C. during the wet etching.

(x) The TMAH aqueous solution comprises a concentration of 2.38% or more.

Advantages of the Invention

According to the invention, a roughened surface having pyramidal projections with crystal surfaces and facets arranged regularly is formed on the surface of a semiconductor layer, and light emitted from the semiconductor layer is extracted through the crystal surface of each projection, so that the light extraction efficiency can be significantly enhanced like never before.

Further, when a wafer with a relatively large area or a plurality of chip LED elements arranged in an array are etched, on the surface of the semiconductor layer where a potential difference may easily occur, erosion nonuniformity due to the potential difference can be appropriately prevented.

BRIEF DESCRIPTION OF THE DRAWINGS

The preferred embodiments according to the invention will be explained below referring to the drawings, wherein:

FIG. 2 is a table showing a concentration and temperature of a KOH aqueous solution for preparation of each sample, and relative light intensity value obtained;

FIG. 11 is a table showing the results of fine processing by wet etching in case of using TMAH aqueous solution;

DETAILED DESCRIPTION OF THE PREFERRED EMBODIMENTS

Figure 1:
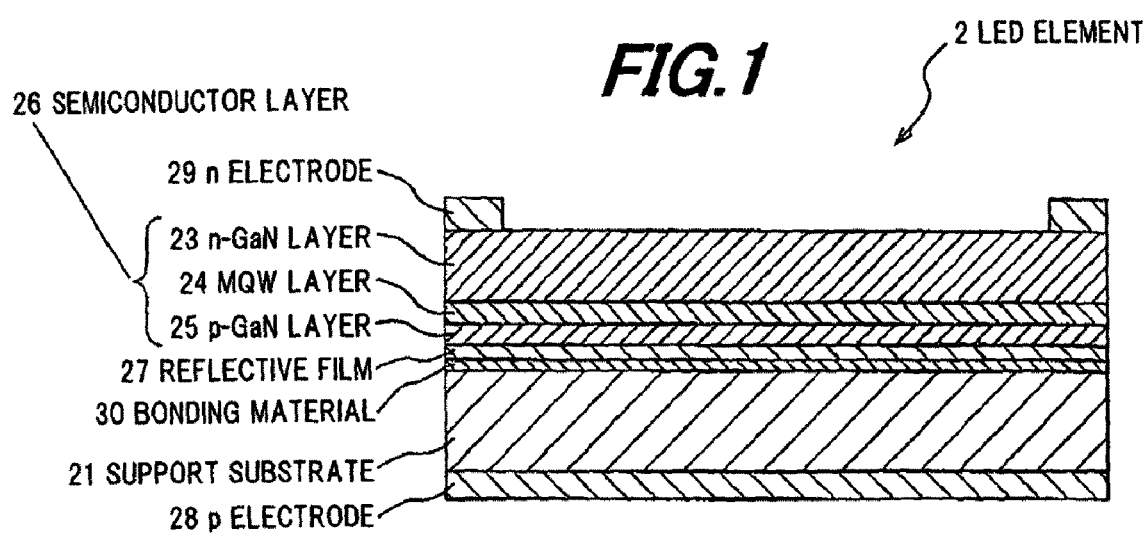
FIG. 1 is a cross sectional view schematically showing an LED element in a first preferred embodiment according to the invention.

FIGS. 1 to 10 shows a first preferred embodiment according to the invention, and FIG. 1 is a cross sectional view schematically showing an LED element.

As shown in FIG. 1, the LED element 2 as a light emitting element has, formed on a conductive support substrate 21, a semiconductor layer 26, which has a p-GaN layer 25, a MQW layer 24, and an n-GaN layer 23 formed sequentially through a conductive bonding material 30 and a conductive reflective film 27.

A p-electrode 28 is formed on the back of the support substrate 21, and an n-electrode 29 is formed on the n-GaN layer 23. The LED element 2 emits light with a peak wavelength in blue region. In this embodiment, the peak wavelength is 460 nm.

A method of making the LED element 2 will be explained below.

First, the n-GaN layer 23, the MQW layer 24, and the p-GaN layer 25 are sequentially formed through a buffer layer on a growth substrate to form the semiconductor layer 26. Then, the conductive reflective film 27 of, e.g., a reflective metal such as Al is formed on the p-GaN layer 25. Then, the conductive support substrate 21 made of Si, Al, Cu etc. as a separate member is bonded to the conductive reflective film 27 as a top layer through the conductive bonding material 30 made of AuSn etc. Then, a laser is irradiated near the interface between the buffer layer and the n-GaN layer 23 from the side of the growth substrate so as to separate the growth substrate with the buffer layer from the remainder. Then, the roughening treatment using the alkali aqueous solution is applied onto the N (nitrogen) surface of the n-GaN layer 23 exposed by the separation as above.

Meanwhile, it is generally known that an N surface is generated on the top surface of an n-GaN layer epitaxially grown while a Ga (gallium) surface is generated on the top surface of a p-GaN layer epitaxially grown. It is confirmed by the inventors that the Ga (gallium) surface of the p-GaN layer 25 is difficult to etch uniformly by using the alkali aqueous solution.

Then, the n-electrode 29 is formed on the n-GaN layer 23 thus treated and the p-electrode 28 is formed on the back side of the support substrate 21.

Thus, the LED element 2 as shown in FIG. 1 can be completed.

In this embodiment, a sapphire substrate is used as the growth substrate. The growth substrate is not limited to this, but another single crystal substrate may be used which includes, for example, spinel, silicon, silicon carbide, zinc oxide, group III nitride based compound semiconductor such as gallium nitride.

The buffer layer is formed of AlN by MOCVD. The buffer layer is not limited to this, but it may include another material such as GaN, InN, AlGaN, InGaN and AlInGaN and it may be formed by another production method such as molecular beam epitaxy (MBE), hydride vapor-phase epitaxy (HVPE), sputtering, ion plating and electron shower.

When the single crystal substrate formed of a group III nitride based compound semiconductor is used as the growth substrate, the buffer layer can be omitted.

The n-GaN layer 23 is formed of GaN doped with Si as an n-type impurity. In this embodiment, the n-GaN layer 23 is formed of GaN, but may be formed of AlGaN, InGaN, or AlInGaN. Although Si is doped to the n-GaN layer 23 as the n-type impurity, another n-type impurity such as Ge, Se, Te and C can be used.

The MQW layer 24 has a predetermined number of pairs of QW (quantum well). For example, the MQW layer 24 has plural blue light emitting layers and barrier layers interposed between the blue light emitting layers. Each of the blue light emitting layers is of $In_{0.2}Ga_{0.8}N$, and each of the barrier layers is of GaN.

The p-GaN layer 25 is formed of GaN doped with Mg as a p-type impurity. In this embodiment, the p-GaN layer 25 is formed GaN, but may be formed of AlGaN, InGaN, or AlInGaN. Although Mg is doped to the p-GaN layer 25 as the p-type impurity, anther p-type impurity such as Zn, Be, Ca, Sr and Ba may be used.

The n-electrode 29 has a two layer structure of V/Al. The p-electrode 28 is a three layer structure of Ti/Ni/Au.

In making the LED element 2 of this embodiment, wet etching is conducted by using an etching solution without irradiating light in all wavelength regions, so that the surface of the semiconductor layer 26 of the LED element 2 is finely processed to be roughened.

Samples 1-48 as shown in FIG. 2 are prepared such that plural LED elements 2 before the roughening treatment are made under the same conditions, and the n-GaN layer 23 as the top surface of the semiconductor layer 26 is etched while changing the concentration and temperature of the KOH aqueous solution.

In preparing Samples 1-48, the concentration of the KOH aqueous solution is changed at six levels and the temperature of the KOH aqueous solution is changed at four levels. Thus, the light intensity is measured on samples prepared under 24 conditions in total.

The etching process is conducted in a dark room so as to prevent light from entering into the samples during the etching. Under each of the conditions, two samples are simultaneously etched for 10 minutes (i.e., the number of samples are 48 in total).

For example, the concentration is set 0.1 mol/L, 0.5 mol/L, 1.0 mol/L, 2.0 mol/L, 4.0 mol/L and 8.0 mol/L, and the temperature is set 20° C., 40° C., 60° C. and 80° C. After preparing the samples, the same electric current is passed through each sample, and the light intensity of each sample is measured by an integrating sphere.

FIG. 2 is a table showing the conditions (concentration and temperature) of KOH aqueous solution under which the samples numbered 1 to 48 are prepared, and the relative light intensity obtained therefrom.

Figure 3:
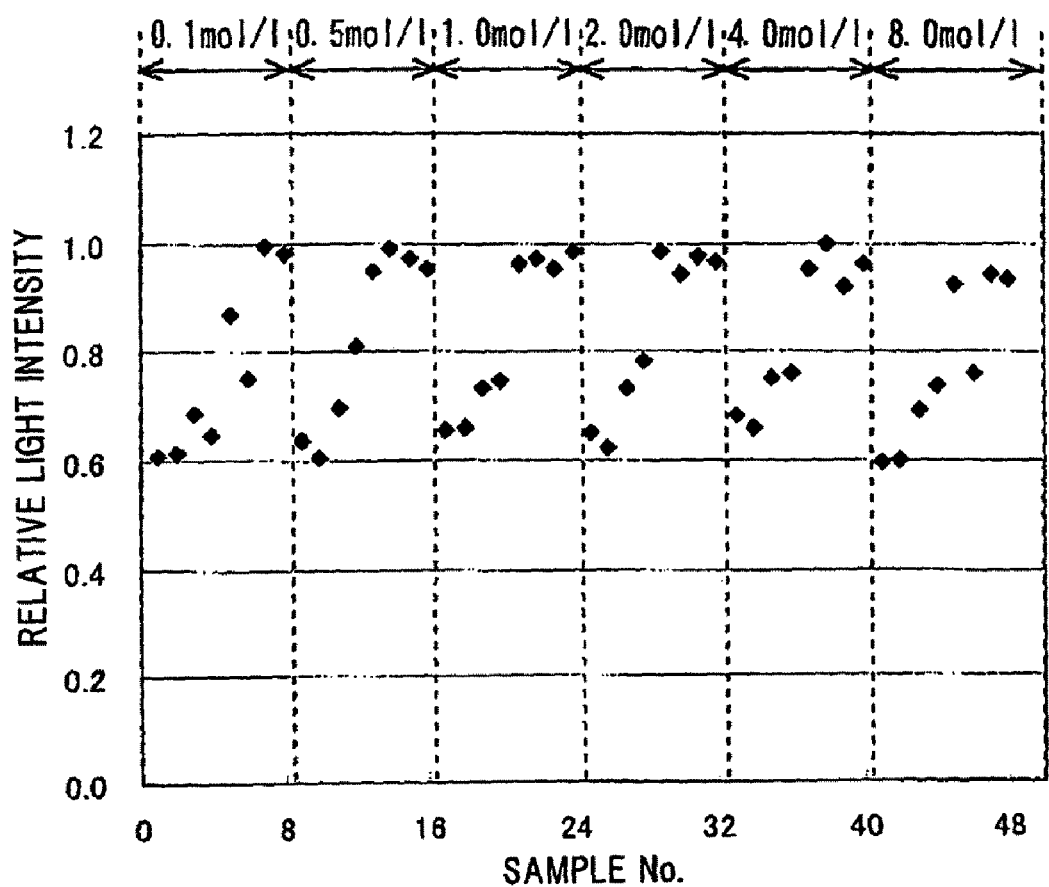
FIG. 3 is a graph showing a relative light intensity of each sample plotted along an ordinate axis.

FIG. 3 is a graph showing the relative light intensity of each sample plotted along the ordinate axis. In FIGS. 2 and 3, the relative light intensity of Sample 1-48 is shown provided that the largest light intensity of the samples is set to be 1.

As shown in FIG. 3, all Samples have a relative light intensity of more than 0.9 when they are prepared in the concentration range of 0.5 mol/L to 4.0 mol/L, and in the temperature range of 60° C. to 80° C.

In contrast, Samples prepared in the temperature range of 20° C. to 40° C. have a low relative light intensity, regardless of the concentration. Further, if the concentration reaches 8.0 mol/L beyond 4.0 mol/L, there is a tendency that the relative light intensity decreases even at 60° C. and 80° C. where the good relative light intensity can have been obtained at a concentration of 4.0 mol/L or less.

Figure 4:
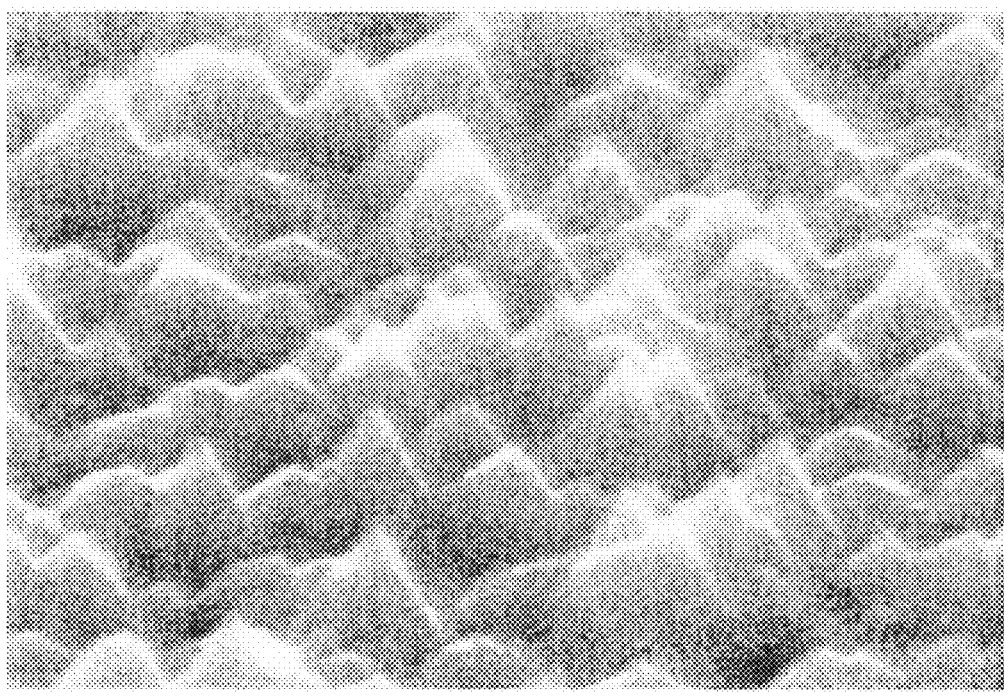
FIG. 4 is a photograph showing the surface state of a semiconductor layer after etching it by KOH aqueous solution, whose concentration and temperature are 0.1 mol/L and 80° C., respectively.
Figure 5:
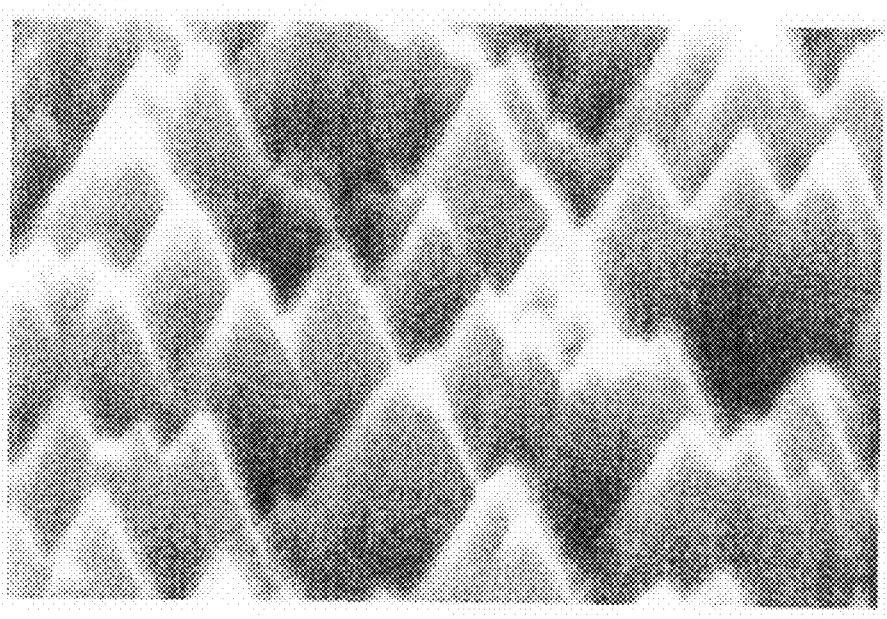
FIG. 5 is a photograph showing the surface state of a semiconductor layer after etching it by KOH aqueous solution, whose concentration and temperature are 0.5 mol/L and 80° C., respectively.
Figure 6:
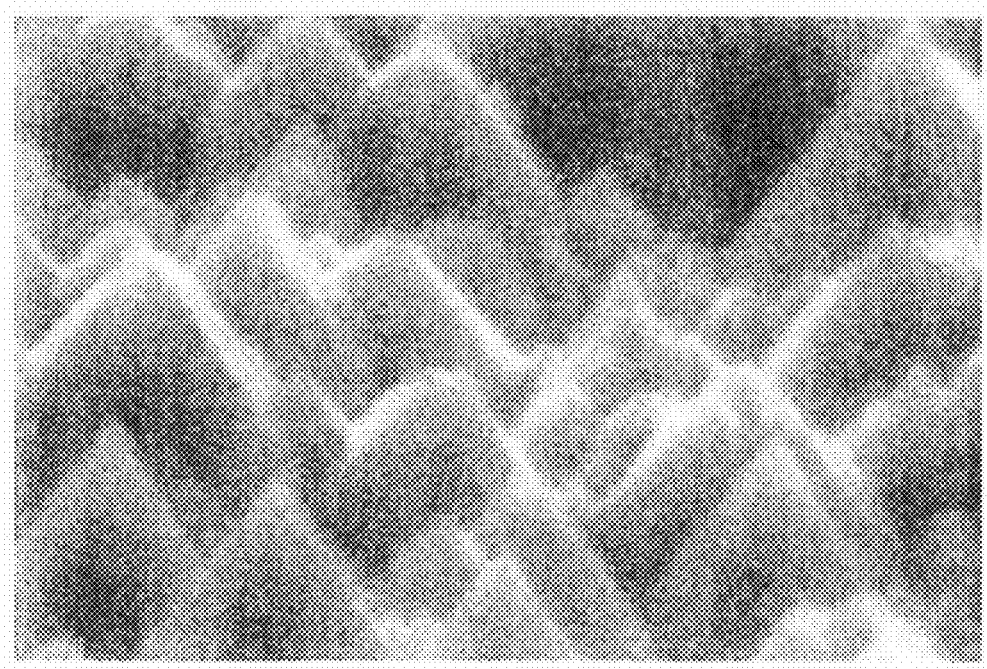
FIG. 6 is a photograph showing the surface state of a semiconductor layer after etching it by KOH aqueous solution, whose concentration and temperature are 1.0 mol/L and 80° C., respectively.
Figure 7:
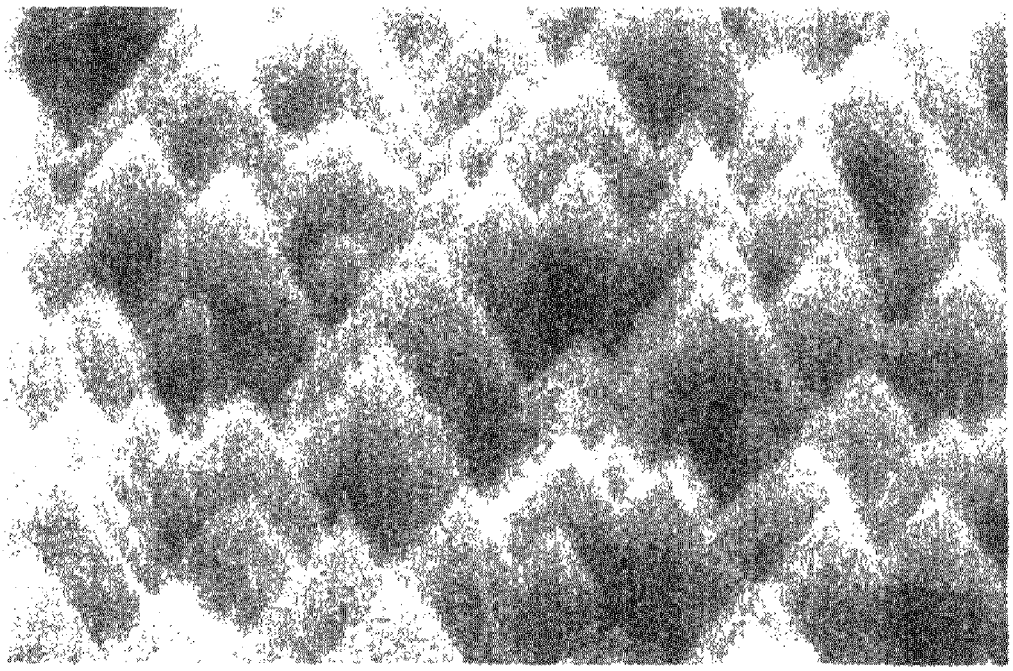
FIG. 7 is a photograph showing the surface state of a semiconductor layer after etching it by KOH aqueous solution, whose concentration and temperature are 2.0 mol/L and 80° C., respectively.
Figure 8:
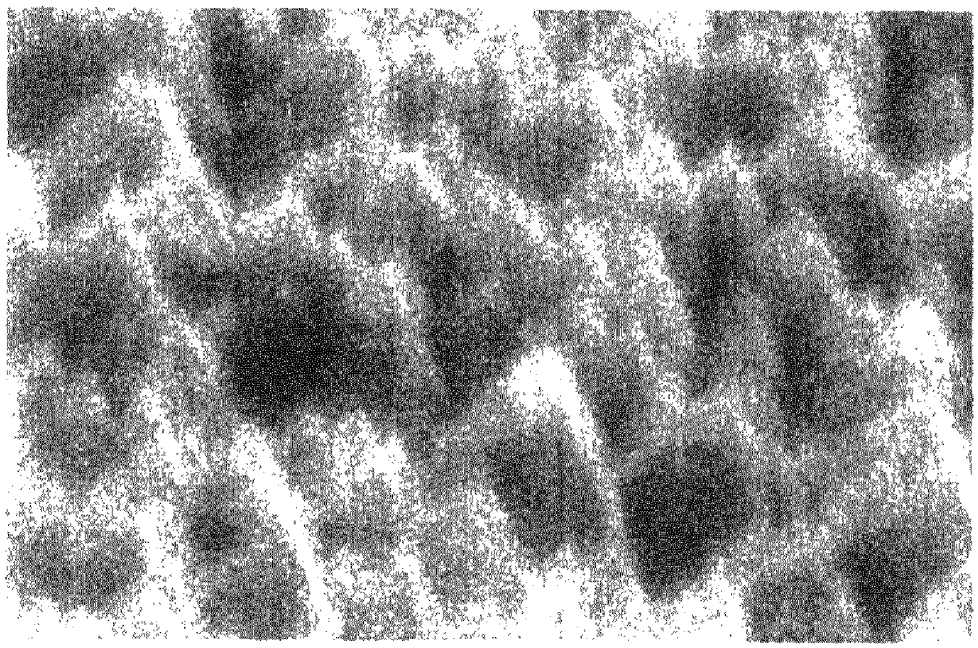
FIG. 8 is a photograph showing the surface state of a semiconductor layer after etching it by KOH aqueous solution, whose concentration and temperature are 4.0 mol/L and 80° C., respectively.
Figure 9:
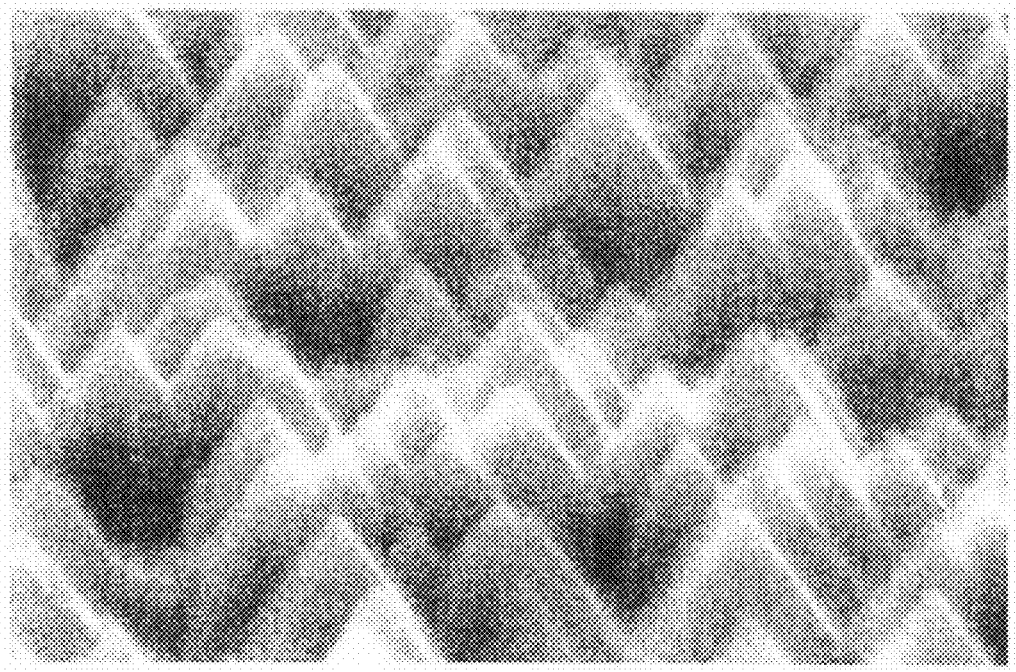
FIG. 9 is a photograph showing the surface state of a semiconductor layer after etching it by KOH aqueous solution, whose concentration and temperature are 8.0 mol/L and 80° C., respectively.

FIGS. 4 to 9 are photographs respectively showing the surface state of the n-GaN layer 23 of the semiconductor layer 26 after etching it by using the KOH aqueous solution, where FIG. 4 shows the state at 0.1 mol/L and 80° C., FIG. 5 shows the state at 0.5 mol/L and 80° C., FIG. 6 shows the state at 1.0 mol/L and 80° C., FIG. 7 shows the state at 2.0 mol/L and 80° C., FIG. 8 shows the state at 4.0 mol/L and 80° C., and FIG. 9 shows the state at 8.0 mol/L and 80° C.

As shown in FIGS. 4 to 9, when the n-GaN layer 23 as the top surface of the semiconductor layer 26 is etched by the KOH aqueous solution without light irradiation, a roughened surface with projections formed on the surface of the semiconductor layer 26 can be obtained. In this case, light with a wavelength region corresponding to energy higher than the bandgap energy of the semiconductor layer 26 does not enter into the semiconductor layer 26 during the etching, so that pairs of electron and hole are not generated in the semiconductor layer 26 by light excitation like before.

Thus, the etching of the semiconductor layer 26 can be advanced stepwise starting from a portion with lower bonding strength at the crystal surface of the semiconductor layer 26. The surface of the semiconductor layer 26 is eroded uniformly, so that as shown in FIGS. 4 to 9, a roughened surface can be obtained after the etching which has pyramidal projections with crystal surfaces and facets regularly arranged thereon.

The light excitation in the semiconductor layer 26 will be explained below referring to FIG. 10.

Figure 10:
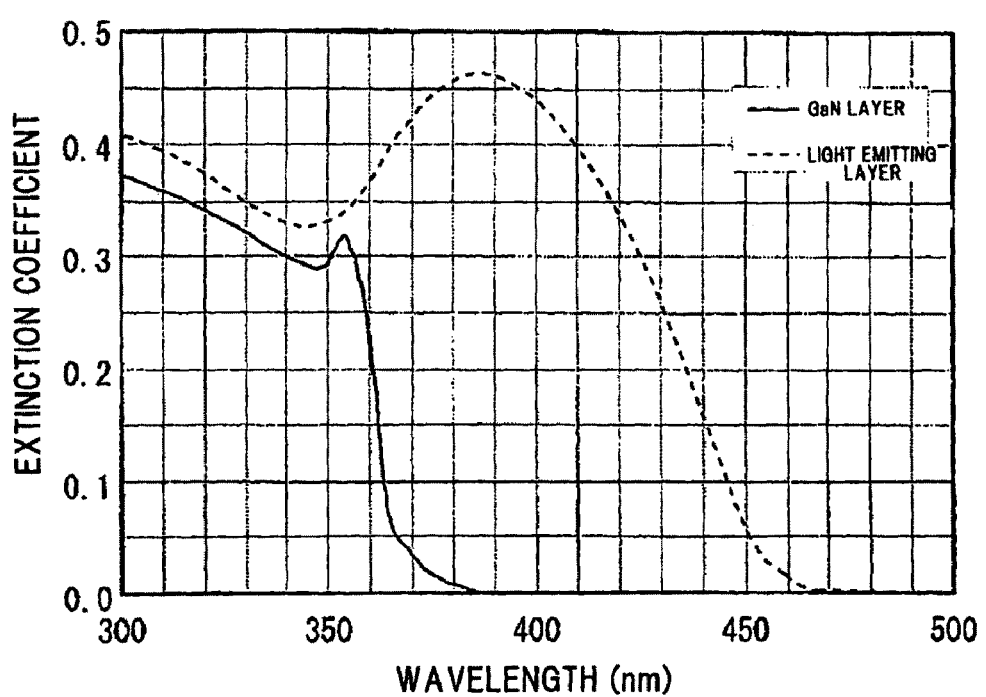
FIG. 10 is a graph showing a relationship between a wavelength and an extinction coefficient in GaN for a p-GaN layer and an n-GaN layer of an LED element, and in $In_{0.2}Ga_{0.8}N$ for a light emitting layer thereof

FIG. 10 is a graph showing the relationship between wavelength and extinction coefficient in GaN for a p-GaN layer and an n-GaN layer of an LED element, and in $In_{0.2}Ga_{0.8}N$ for a light emitting layer thereof.

As shown in FIG. 10, the extinction coefficient of GaN becomes zero to light with a wavelength longer than 390 nm, and the extinction coefficient of $In_{0.2}Ga_{0.8}N$ becomes nearly zero to light with a wavelength longer than 460 nm. The bandgap energies (Eg) of GaN and $In_{0.2}Ga_{0.8}N$ are calculated 3.5 eV (390 nm) and 2.8 eV (460 nm), respectively, by the following formula (1) from the spectral absorption edge and correspond to the wavelengths described above.

$$\alpha(h\upsilon)=A(h\upsilon-Eg)^{1/2} \quad (1)$$

where α represents an absorption coefficient, h represents the Plank's constant, υ represents the frequency of light, and A represents a constant. When the extinction coefficient nears zero, the light absorption hardly occurs so that generation of pairs of electron and hole due to light excitation in the semiconductor decreases.

In this embodiment, if the GaN layer corresponding to the surface layer of the semiconductor layer is etched, it is only necessary to prevent the irradiation of light with a wavelength shorter than 390 nm corresponding to Eg of GaN. If the light emitting layer is etched, it is only necessary to prevent the irradiation of light with a wavelength shorter than 460 nm corresponding to Eg of $In_{0.2}Ga_{0.8}N$.

Thus, it is preferable to avoid the irradiation of light with a wavelength shorter than 460 nm corresponding to Eg of the light emitting layer which has the lowest Eg of the layers composing the semiconductor layer 26.

A fluorescent light used for illumination generally in the etching causes a phosphor with a visible emission region to emit by its light irradiation at a mercury plasma excitation wavelength of 253.7 nm. Therefore, if the etching process is conducted with the irradiation of the fluorescent light, unevenness in the etching progress will be caused, so that it is difficult to obtain the roughened surface as shown in FIGS. 4 to 9.

Figure 17:
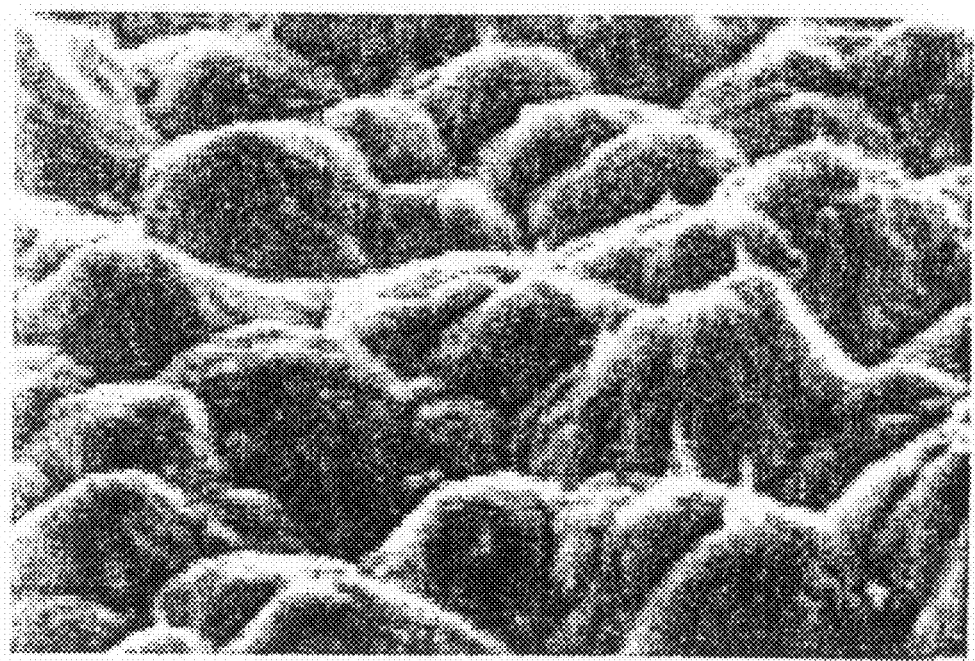
FIG. 17 is a photograph showing, as a conventional example, the surface state of a semiconductor layer after etching it by using KOH aqueous solution.

As shown in FIG. 4, when the concentration is 0.1 mol/L, the uniformity in surface roughness is improved as compared to the conventional roughened surface as shown in FIG. 17, but flat portions remain on the surface of the semiconductor layer 26 and the shape of the projections is nonuniform and unregulated.

As shown in FIG. 5, when the concentration is 0.5 mol/L, the uniformity in surface roughness is improved as compared to the case of 0.1 mol/L, and the projections has a uniform shape, but flat portions remain on the surface of the semiconductor layer 26.

In contrast, as shown in FIGS. 6 to 9, when the concentration is in the range of 1.0 mol/L to 8.0 mol/L, a roughened surface can be obtained that has projections with a uniform shape and facets arranged regularly thereon without leaving the flat portions on the surface of the semiconductor layer 16. That is, there is a tendency that when the concentration of the KOH aqueous solution lowers, the projections become nonuniform and the flat portions increase on the surface of the semiconductor layer 26.

As shown in FIGS. 8 and 9, when the concentration is in the range of 4.0 mol/L to 8.0 mol/L, minute concavity and convexity are formed on the surface of each projection relatively more than the case of the other concentration conditions.

In contrast, as shown in FIGS. 6 and 7, when the concentration is in the range of 1.0 mol/L to 2.0 mol/L, the minute concavity and convexity formed on the surface of each projection do not exist or become relatively less. The decrease of the light intensity when the concentration is beyond 4.0 mol/L and reaches 8.0 mol/L as shown in FIG. 3 is caused by the minute concavity and convexity.

Thus, in the method of making the LED element 2 of the first embodiment, light with a wavelength region corresponding to energy higher than the bandgap energy of the semiconductor layer 26 is not irradiated to the semiconductor layer 26 during the etching process, so that the roughened surface which has the pyramidal projections with crystal surfaces and the facets arranged regularly thereon can be obtained on the surface of the semiconductor layer 26 after the etching. Thus, light emitted from the MQW layer 24 can be efficiently discharged outside the LED element 2 without being reflected inside the semiconductor layer 26.

Further, when a wafer with a relatively large area or a plurality of chip LED elements arranged in an array are etched, on the surface of the semiconductor layer 26 where a potential difference may easily occur, erosion nonuniformity due to the potential difference can be appropriately prevented.

In particular, as shown in FIG. 3, it is confirmed that when the concentration of the KOH aqueous solution is in the range of 0.5 mol/L to 4.0 mol/L, the increased light intensity can be stably extracted from the concave-convex formed surface on the etched crystal surface. Further, it is also confirmed that when the temperature of the KOH aqueous solution is in the range of 60° C. to 80° C., the increased light intensity can be stably extracted therefrom.

Further, when the concentration of the KOH aqueous solution is in the range of 1.0 mol/L to 2.0 mol/L, the roughened surface can be obtained which has the projections with a uniform shape and the facets arranged regularly without leaving the flat portions on the surface of the semiconductor layer 26. In addition, since the minute concavity and convexity is not formed or relatively less formed on the surface of each projection, the light extraction efficiency can be sufficiently enhanced.

In the first embodiment, the etching process is conducted without irradiating light in all wavelength regions. However, the same effects as the first embodiment can be obtained by avoiding the irradiation of light with a wavelength region corresponding to energy higher than the bandgap energy of the semiconductor layer 26.

In other words, for the LED element 2 of the first embodiment, even when the etching process is conducted under the irradiation of green light, red light etc. with a wavelength of 460 nm (corresponding to Eg of the light emitting layer) or more, the roughened surface that has the pyramidal projections with crystal surfaces and the facets arranged regularly thereon can be obtained.

The first embodiment is exemplified by the LED element 2 to emit blue light. However, the invention can be also applied to the LED element 2 to emit green light. In this case, it is only necessary to conduct the etching process without irradiating all lights, or to conduct the etching process by irradiating red light (or longer-wavelength light than the green light).

The first embodiment is exemplified by the KOH aqueous solution as the etching solution. However, the other alkali aqueous solutions such as NaOH aqueous solution and $NH_3$ aqueous solution can be also used, and alternatively acid aqueous solutions can be also used if it can be used to etch the semiconductor layer 26. Needless to say, solvents other than water can be also used.

For example, the abovementioned alkali aqueous solutions (etching solution) include tetramethylammonium hydroxide (TMAH). The second preferred embodiment of the invention is composed such that the roughening treatment (or fine processing) by using the TMAH aqueous solution is made to the surface (i.e., N (nitrogen) surface) of the n-GaN layer 23 separated from the sapphire substrate by the laser irradiation to complete the LED element 2 as shown in FIG. 1.

FIGS. 11 to 15 show the second embodiment of the invention. FIG. 11 is a table showing the results of fine processing by wet etching in case of using the TMAH aqueous solution.

In the method of making the LED element 2 of the second embodiment, the wet etching is conducted by using the TMAH aqueous solution heated at a predetermined temperature without irradiating light in all wavelength regions as done in the first embodiment. In this embodiment, the concentration of the TMAH aqueous solution is set 2.38%. This concentration is the same as that of a photoresist developing solution used typically in the semiconductor fabrication process. Samples 2-1 to 2-18 are prepared such that plural LED elements 2 made under the same conditions are provided and the surface of the n-GaN layer 23 is etched by using the TMAH aqueous solution while changing the temperature of the TMAH aqueous solution. The time for the fine processing by the etching is set 10 min.

FIG. 11 includes data for each of Samples 2-1 to 2-18, i.e., temperature of the fine processing, current fed in the measurement of light extraction efficiency, total radiant flux before the fine processing, total radiant flux after the fine processing, and a ratio in total radiant flux between after and before the fine processing.

Figure 12:
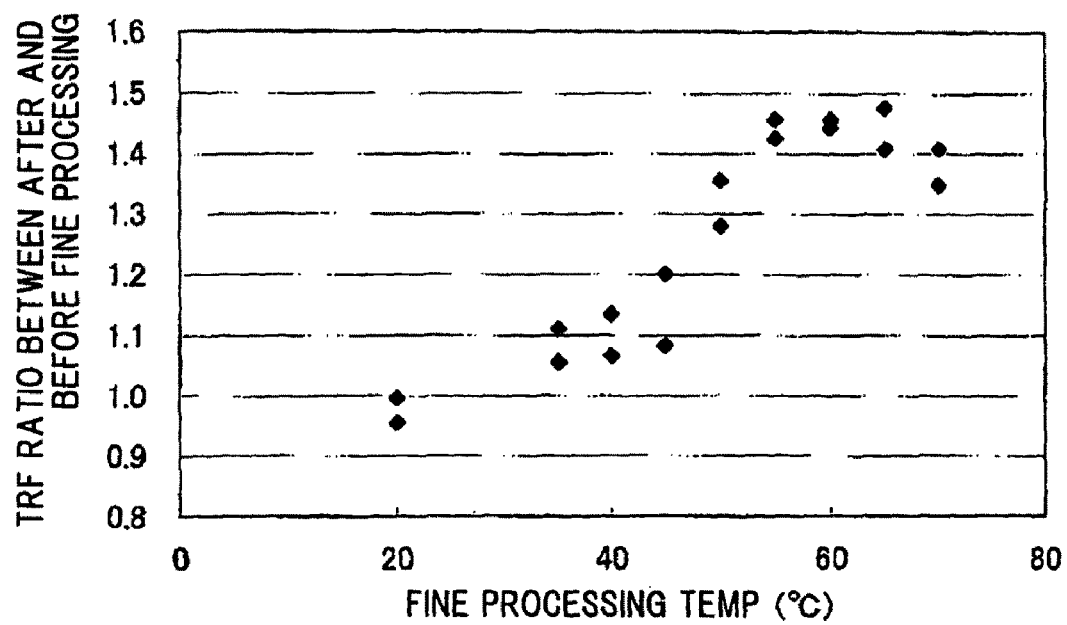
FIG. 12 is a graph showing a ratio in total radiant flux between before and after the fine processing to the fine processing temperature change of each sample in FIG. 11.

FIG. 12 is a graph showing a ratio in total radiant flux between after and before the fine processing to the fine processing temperature change of each sample in FIG. 11. In FIG. 12, data are ratios in total radiant flux between after and before the fine processing obtained by two samples provided for each temperature condition.

As shown in FIG. 12, when the temperature of the TMAH aqueous solution is 35° C. or more, it is confirmed that the total radiant flux can be improved and, especially in the range of 55 to 65° C., significant improvement in total radiant flux of more than 1.4 can be obtained. This proves that the etching of the TMAH aqueous solution is well advanced on the surface (i.e., on the n-type face of the GaN crystal) of the n-GaN layer 23 separated from the sapphire substrate by the laser irradiation. Although the total radiant flux tends to lower at a fine processing temperature of 70° C., a total radiant flux of more than 1.3 can be obtained nevertheless.

Thus, even for AlGaN layer with lower Al ratio or GaN layer (which cannot be etched by the conventional etching method using the TMAH aqueous solution), the surface of the GaN layer separated from the sapphire by the laser irradiation can be etched by the TMAH aqueous solution under the abovementioned conditions, i.e., at the specific concentration and temperature of the TMAH aqueous solution.

FIGS. 13A to 13D are photographs showing the surface state of an n-GaN layer after etching it by using the TMAH aqueous solution while changing the fine processing time.

Figure 13A:
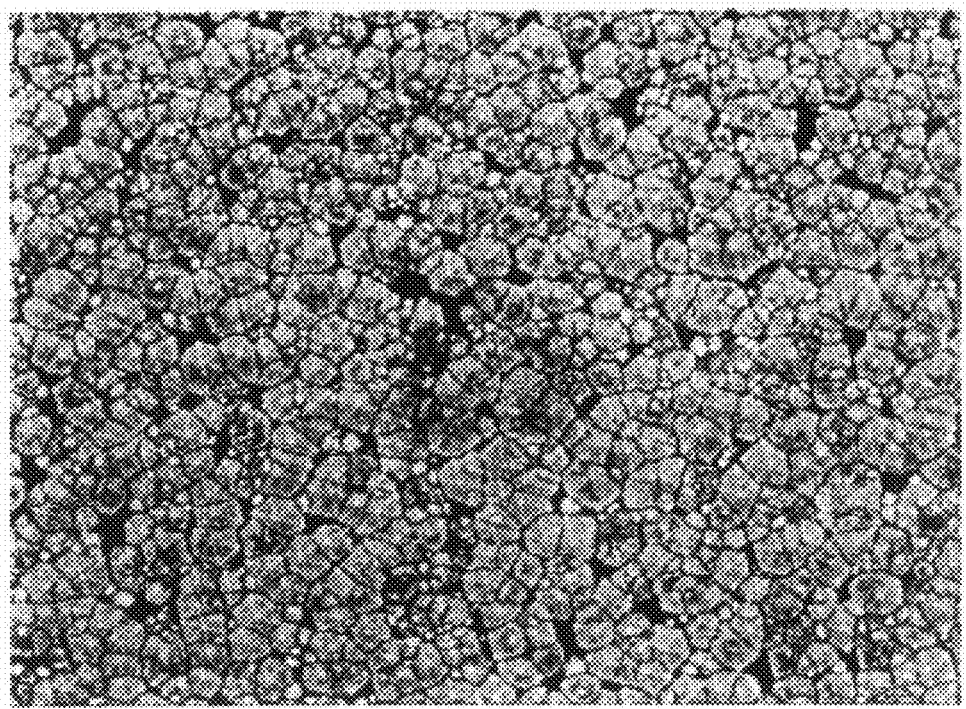
FIG. 13A is a photograph showing the surface state of an n-GaN layer after etching it by using the TMAH aqueous solution while changing the fine processing time, where the processing temperature and time are 60° C. and 10 min, respectively.
Figure 13B:
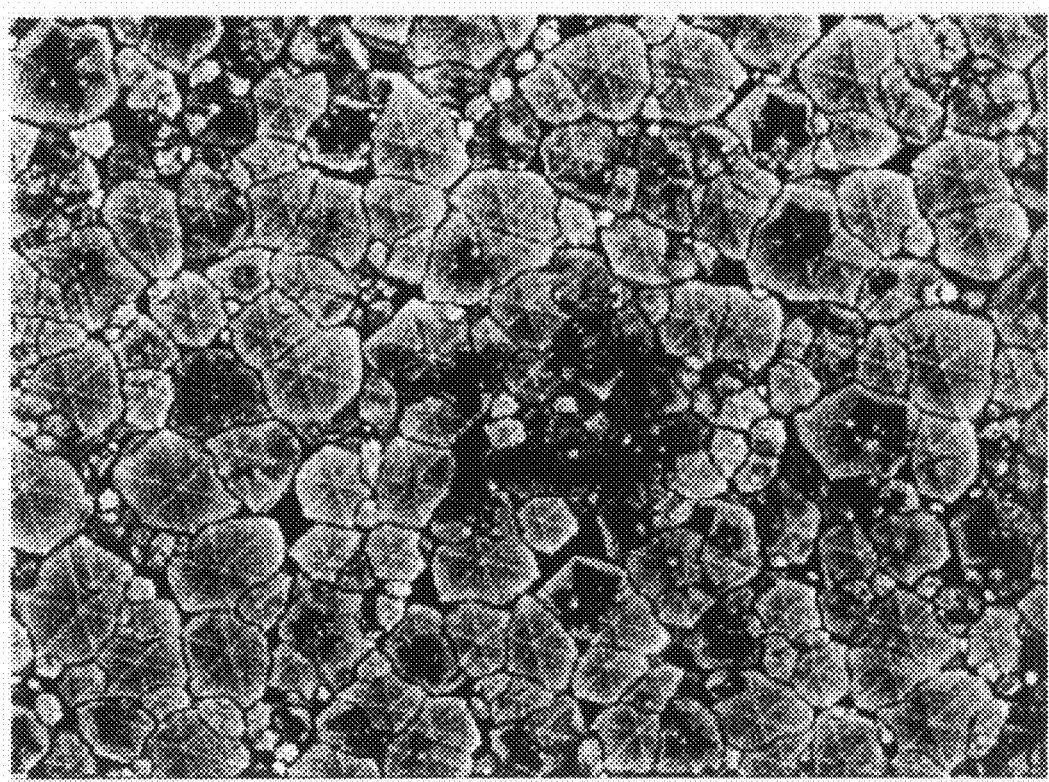
FIG. 13B is a photograph showing the surface state of an n-GaN layer after etching it by using the TMAH aqueous solution while changing the fine processing time, where the processing temperature and time are 60° C. and 15 min, respectively.
Figure 13C:
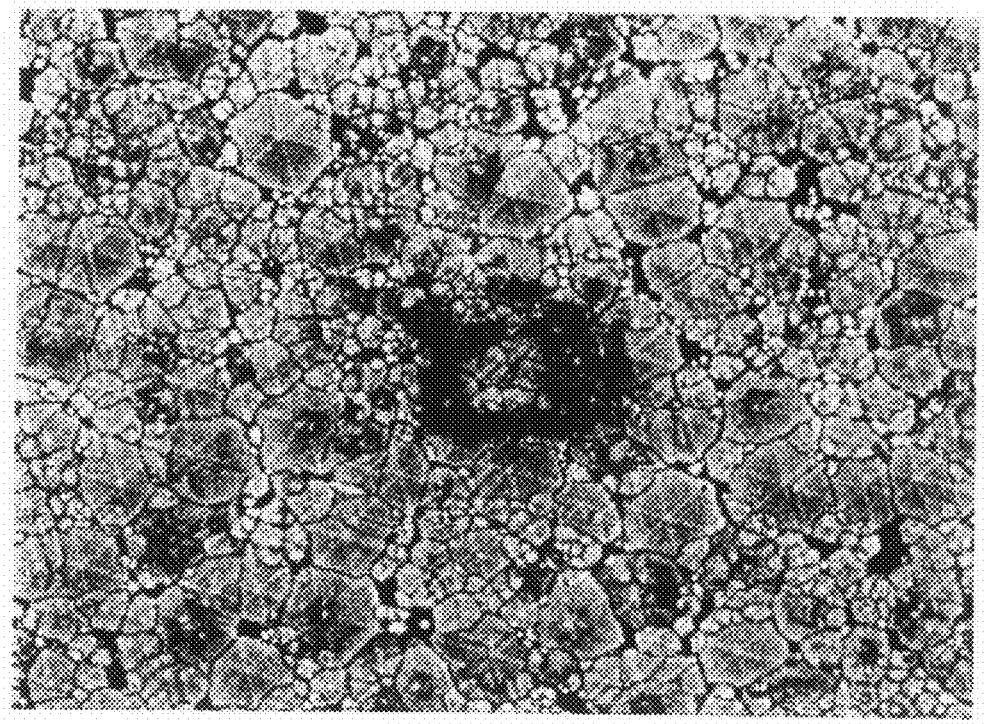
FIG. 13C is a photograph showing the surface state of an n-GaN layer after etching it by using the TMAH aqueous solution while changing the fine processing time, where the processing temperature and time are 60° C. and 20 min, respectively.
Figure 13D:
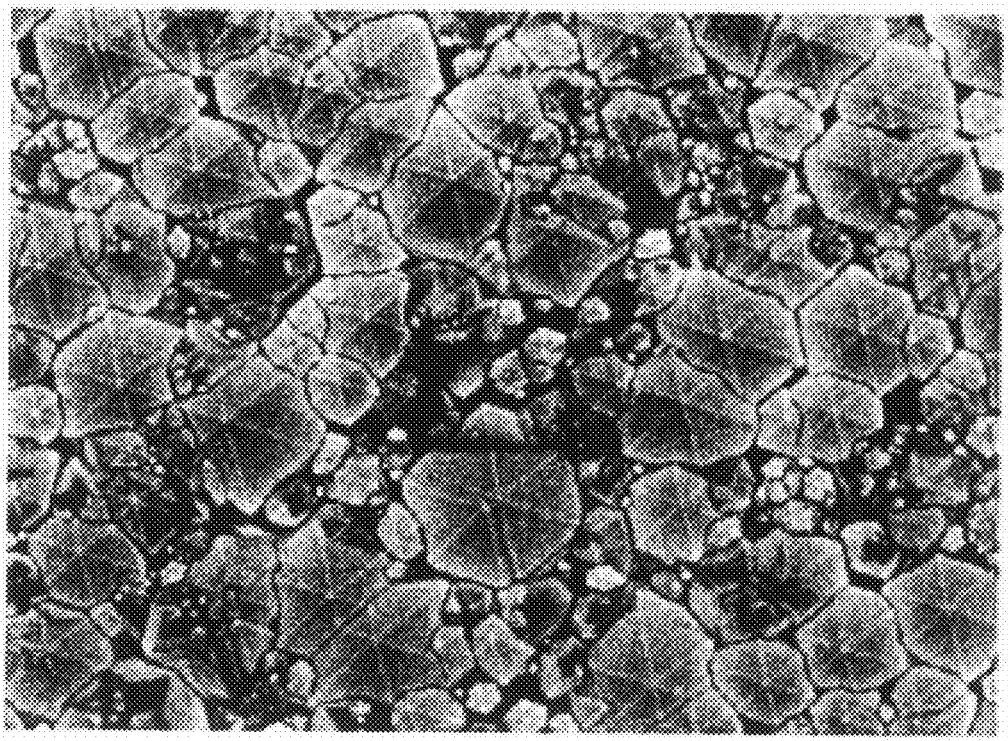
FIG. 13D is a photograph showing the surface state of an n-GaN layer after etching it by using the TMAH aqueous solution while changing the fine processing time, where the processing temperature and time are 60° C. and 25 min, respectively.
Figure 14A:
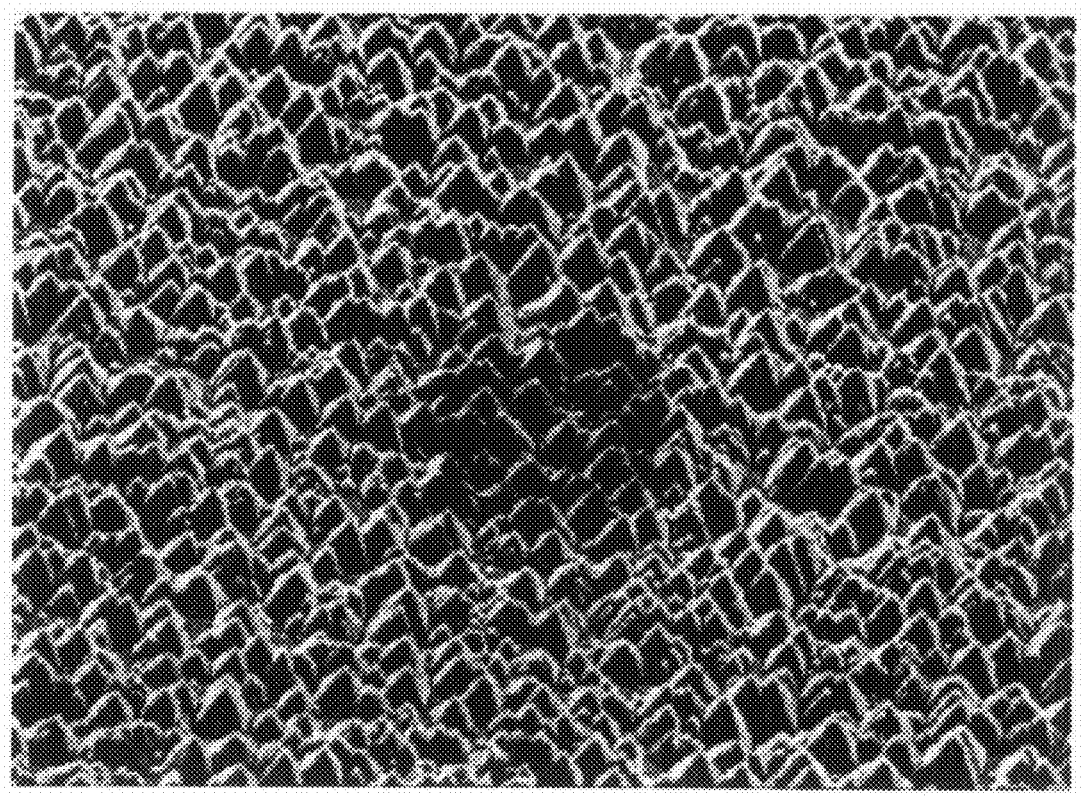
FIG. 14A is a photograph showing the surface state of the n-GaN layer in FIG. 13A viewed at a depression angle of 45°.
Figure 14B:
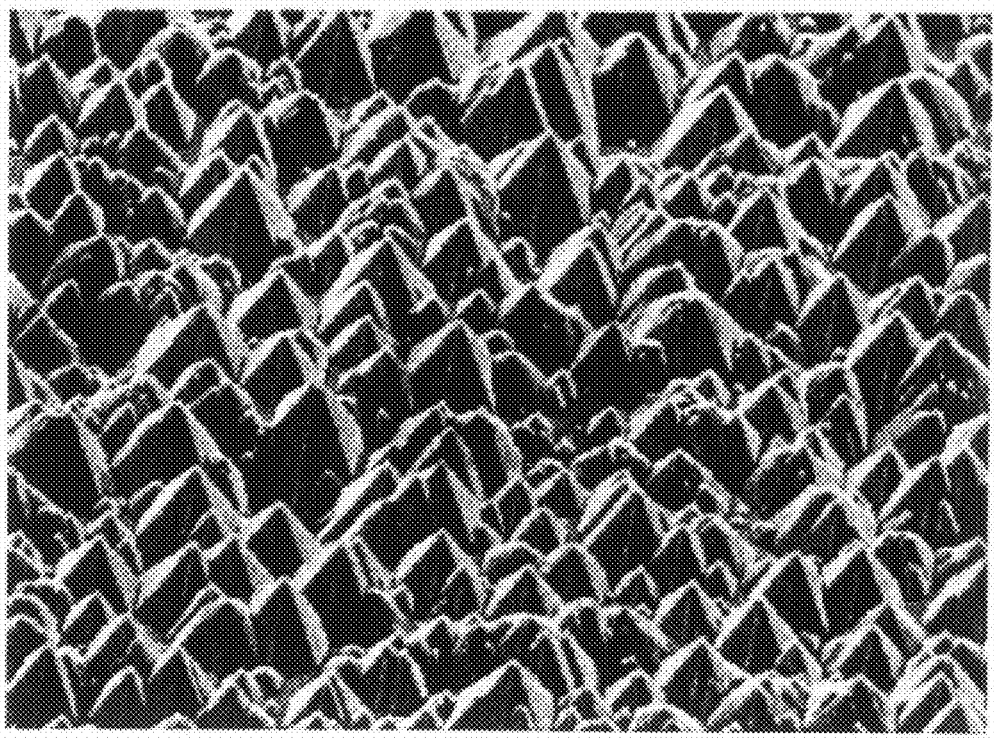
FIG. 14B is a photograph showing the surface state of the n-GaN layer in FIG. 13B viewed at a depression angle of 45°.
Figure 14C:
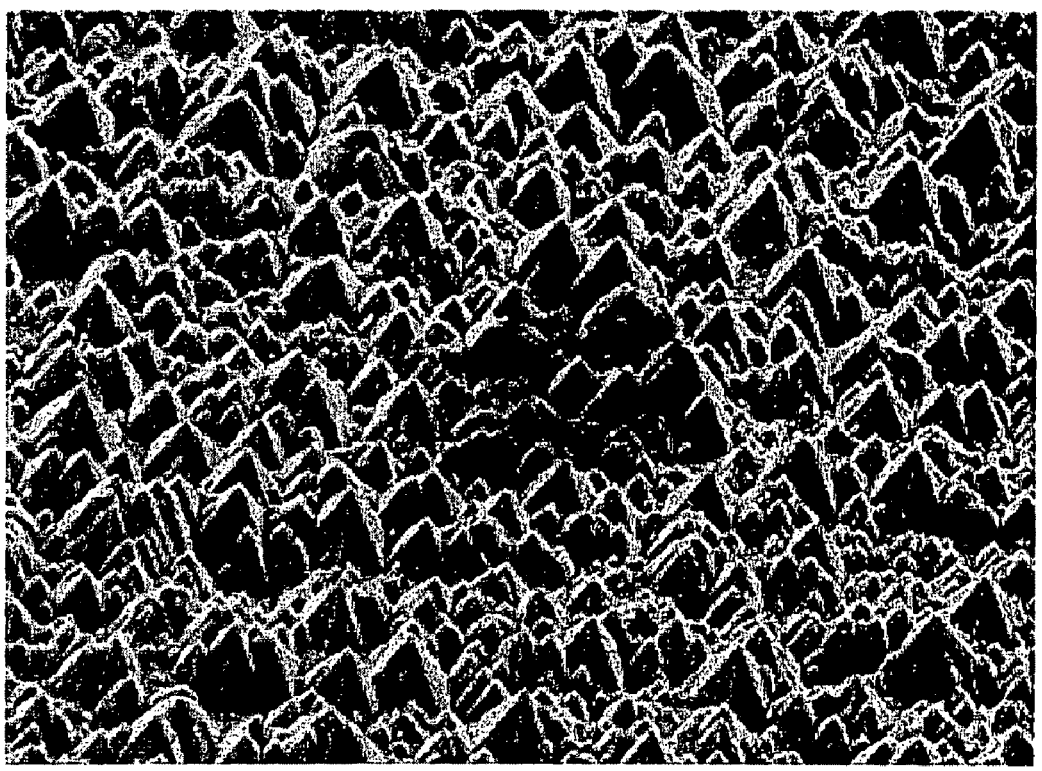
FIG. 14C is a photograph showing the surface state of the n-GaN layer in FIG. 13C viewed at a depression angle of 45°.
Figure 14D:
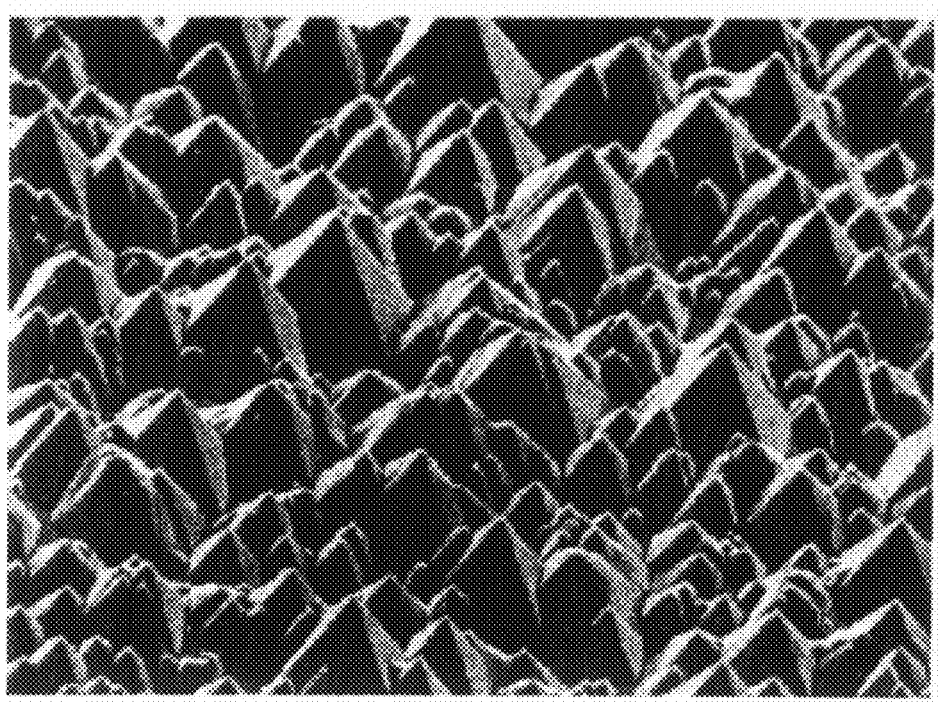
FIG. 14D is a photograph showing the surface state of the n-GaN layer in FIG. 13D viewed at a depression angle of 45°.

FIG. 13A shows data at temperature of 60° C. and fine processing time of 10 min, FIG. 13B shows data at temperature of 60° C. and fine processing time of 15 min, FIG. 13C shows data at temperature of 60° C. and fine processing time of 20 min, and FIG. 13D shows data at temperature of 60° C. and fine processing time of 25 min.

FIGS. 14A to 14D are photographs showing the surface state of the n-GaN layer in FIGS. 13A to 13D viewed at a depression angle of 45°.

As shown in FIGS. 14A to 14D, as the fine processing time goes by, the roughness of the surface of the n-GaN layer is advanced and the flat portions tend to decrease. Thus, by setting the fine processing time more than 10 min while keeping the temperature of the TMAH aqueous solution constant, the roughened surface with the projections with a uniform shape arranged regularly thereon can be obtained to enhance the light extraction efficiency.

Also in the second embodiment, even under the conditions that the amount of light irradiation is reduced as much as possible although the light irradiation is not completely blocked, the roughened surface can be obtained that has the pyramidal projections with crystal surfaces and facets regularly arranged thereon.

Figure 15A:
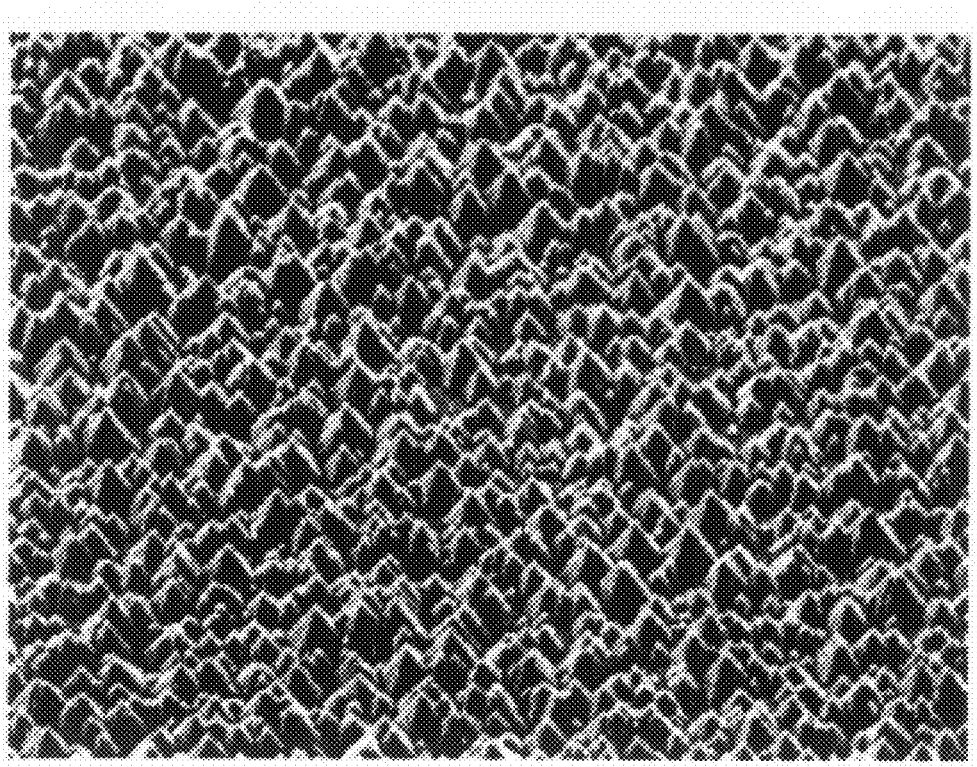
FIG. 15A is a photograph showing the surface state of an n-GaN layer after etching it by using the TMAH aqueous solution while irradiating the surface with a light of 365 nm, where the processing temperature and time are 60° C. and 10 min, respectively.
Figure 15B:
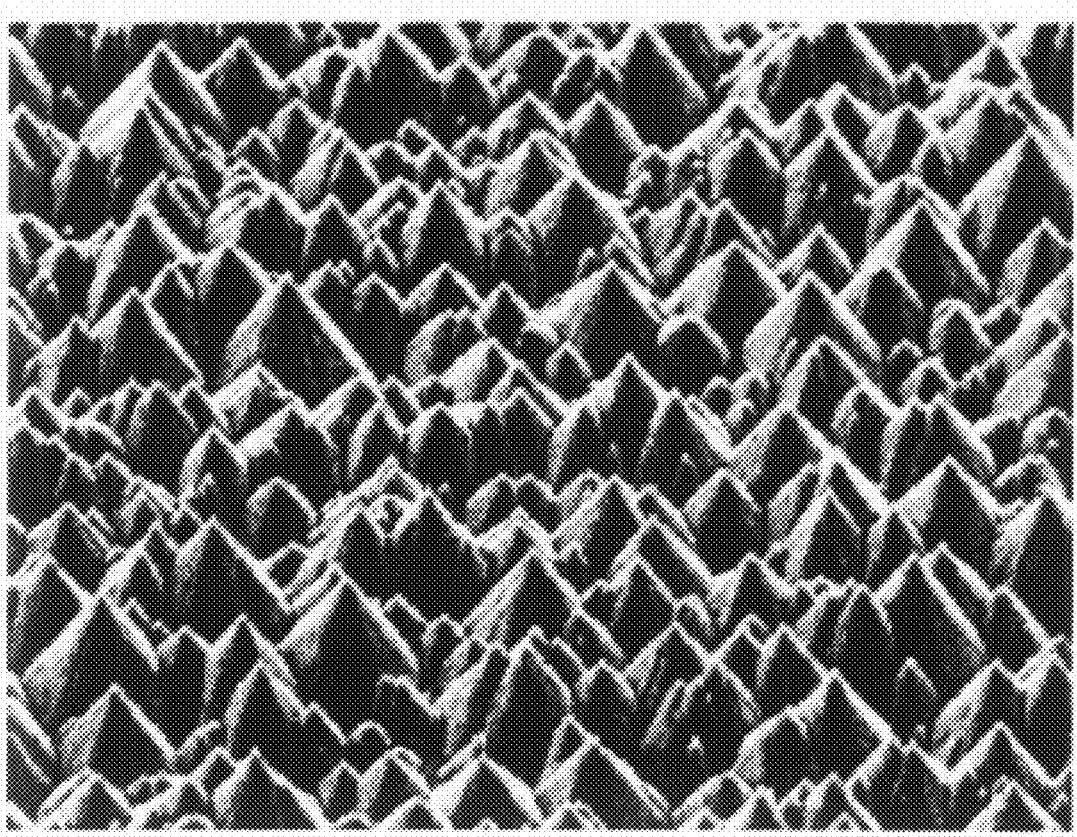
FIG. 15B is a photograph showing the surface state of an n-GaN layer after etching it by using the TMAH aqueous solution while irradiating the surface with a light of 365 nm, where the fine processing temperature and time are 60° C. and 30 min, respectively.

FIGS. 15A and 15B are photographs showing the surface state of an n-GaN layer after etching it by using the TMAH aqueous solution while irradiating the surface with a light of 365 nm. FIG. 15A shows data that the processing temperature and time are 60° C. and 10 min, respectively. FIG. 15B shows data that the processing temperature and time are 60° C. and 30 min, respectively.

Figure 15C:
FIG. 15C is a photograph showing, as a comparative example, the surface state of an n-GaN layer after etching it by using the KOH aqueous solution while irradiating the surface with a light of 365 nm, where the fine processing temperature and time are 60° C. and 10 min, respectively.

As shown in FIGS. 15A and 15B, by irradiating the surface with a light of 365 nm, the erosion of the n-GaN layer is enhanced but pairs of electron and hole is generated inside the n-GaN layer and, as the time goes by, the pyramidal projections arranged irregularly increase and the crystals are excessively eroded to have the pyramidal shape deformed or unstable. Meanwhile, under the conditions that the fine processing temperature and time are 60° C. and 10 min, respectively, as compared to a comparative example as shown in FIG. 15C where the surface of an n-GaN layer is etched by using the KOH aqueous solution with the light irradiation at 365 nm, the pyramidal projections (in FIG. 15A) can be obtained the same as or better than the comparative example.

As shown in FIG. 15A, the etching with the light irradiation at 365 nm and for 10 min appears to have a good result similar to the etching conditions by the KOH aqueous solution and without the light irradiation. However, as shown in FIG. 15B, with the light irradiation at 365 nm and for 30 min, the crystal faces (or facets) are not generated on the etched surface as in the etching with the light irradiation for 10 min using the KOH aqueous solution, and the pyramidal shape is deformed to increase the degree of nonuniformity. This proves that it is preferable to conduct the etching process (or fine processing) without the light irradiation in any event.

Figure 16A:
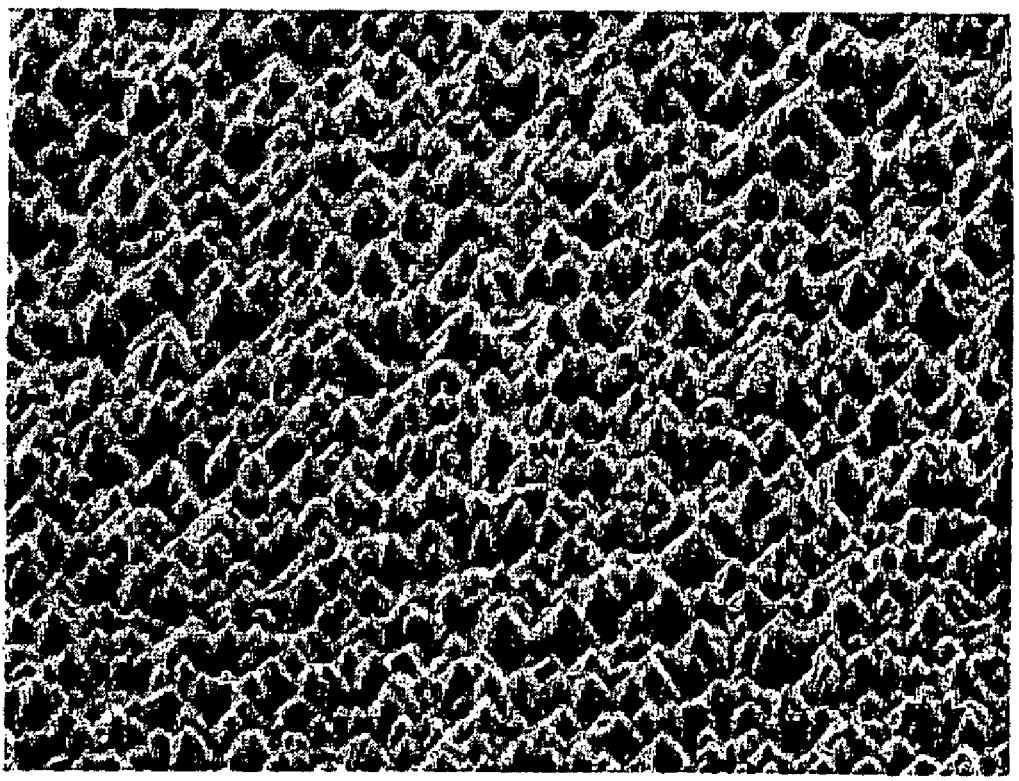
FIG. 16A is a photograph showing the surface state of an n-GaN layer after etching it by using the TMAH aqueous solution without irradiating any light, where the fine processing temperature and time are 60° C. and 10 min, respectively.
Figure 16B:
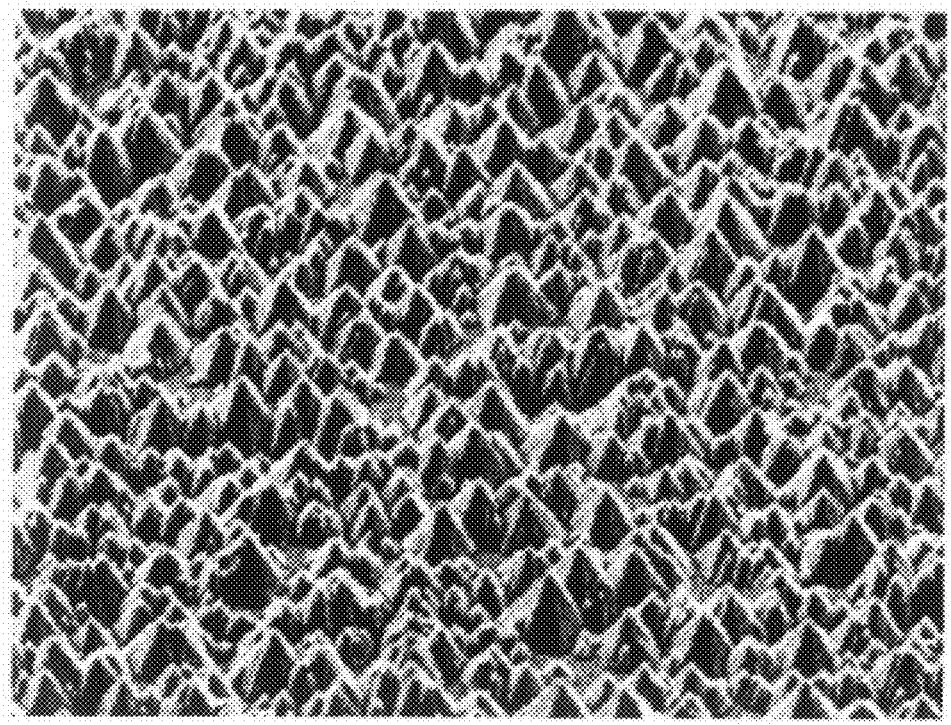
FIG. 16B is a photograph showing the surface state of an n-GaN layer after etching it by using the TMAH aqueous solution without irradiating any light, where the fine processing temperature and time are 60° C. and 30 min, respectively.

FIGS. 16A and 16B are photographs showing the surface state of an n-GaN layer after etching it by using the TMAH aqueous solution without light irradiation. FIG. 16A shows data that the processing temperature and time are 60° C. and 10 min, respectively. FIG. 16B shows data that the processing temperature and time are 60° C. and 30 min, respectively. Thus, under the above conditions that the light irradiation is completely blocked, the roughened surface can be also obtained that has the pyramidal projections with crystal surfaces and facets regularly arranged thereon as in the case of the light irradiation. This provides the same tendency as the case of using the KOH aqueous solution.

As described above, in the method of making the LED element 2 of the second embodiment, by using the TMAH aqueous solution, which is easily available, not expensive and typically used in the semiconductor fabrication process, as the other alkali aqueous solution than the KOH aqueous solution, the nano-order fine processing to the GaN surface can be performed like the KOH aqueous solution.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a light emitting element, the light emitting element comprising a semiconductor layer represented by: $Al_X In_Y Ga_{1-X-Y} N$ ($0 \leqq X \leqq 1$, $0 \leqq Y \leqq 1$, $0 \leqq X+Y \leqq 1$), comprising the step of
   wet-etching a surface of the semiconductor layer by using an etching solution to have a roughened surface on the semiconductor layer,
   wherein the wet-etching is conducted without irradiating the surface of the semiconductor layer with a light comprising a wavelength region corresponding to energy higher than a bandgap energy of the semiconductor layer.

2. The method according to claim 1, wherein:
   the surface of the semiconductor layer to be wet-etched comprises an N (nitrogen) surface.

3. The method according to claim 1, wherein:
   the etching solution comprises an alkaline aqueous solution.

4. The method according to claim 3, wherein:
   the alkaline aqueous solution comprises KOH aqueous solution.

5. The method according to claim 4, wherein:
   the KOH aqueous solution comprises a temperature in the range of 60° C. to 80° C. during the wet etching.

6. The method according to claim 4, wherein:
   the KOH aqueous solution comprises a concentration in the range of 0.5 mol/L to 4.0 mol/L.

7. The method according to claim 4, wherein:
   the KOH aqueous solution comprises a concentration in the range of 1.0 mol/L to 2.0 mol/L.

8. The method according to claim 3, wherein:
   the alkaline aqueous solution comprises tetramethylammonium hydroxide (TMAH) aqueous solution.

9. The method according to claim 8, wherein:
   the TMAH aqueous solution comprises a temperature in the range of 35° C. to 70° C. during the wet etching.

10. The method according to claim 9, wherein:
    the TMAH aqueous solution comprises a temperature in the range of 55° C. to 65° C. during the wet etching.

* * * * *